United States Patent
Shi et al.

(10) Patent No.: US 12,557,534 B2
(45) Date of Patent: Feb. 17, 2026

(54) DISPLAY PANEL AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Bo Shi, Beijing (CN); Ming Hu, Beijing (CN); Taofeng Xie, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 590 days.

(21) Appl. No.: 18/022,875

(22) PCT Filed: May 18, 2022

(86) PCT No.: PCT/CN2022/093656
§ 371 (c)(1),
(2) Date: Feb. 23, 2023

(87) PCT Pub. No.: WO2023/220984
PCT Pub. Date: Nov. 23, 2023

(65) Prior Publication Data
US 2024/0276849 A1    Aug. 15, 2024

(51) Int. Cl.
*H10K 59/80* (2023.01)
*H10K 59/122* (2023.01)
(Continued)

(52) U.S. Cl.
CPC ......... *H10K 59/879* (2023.02); *H10K 59/122* (2023.02); *H10K 59/35* (2023.02);
(Continued)

(58) Field of Classification Search
CPC .......................... H10K 59/873; H10K 59/879
See application file for complete search history.

(56) References Cited

U.S. PATENT DOCUMENTS

2019/0115404 A1    4/2019   Moon et al.
2021/0184179 A1    6/2021   Kim et al.
(Continued)

FOREIGN PATENT DOCUMENTS

CN    109216581 A    1/2019
CN    114122080 A    3/2022
(Continued)

*Primary Examiner* — Mariceli Santiago
(74) *Attorney, Agent, or Firm* — WHDA, LLP

(57) ABSTRACT

A display panel includes: a display baseplate, including a light-emitting area and a non-illuminated area surrounding the light-emitting area, the light-emitting area includes a first light-emitting area located in a first display area, and a second light-emitting area located in a second display area; a functional film layer set on the light outlet side of the display baseplate; a low-refractive layer set at a side of the functional film layer divergence display baseplate; the first high refractive layer is set at a side of the low refractive layer divergence display baseplate; the refractive index of the first high refractive layer is larger than that of the low refractive layer, the low refractive layer and the first high refractive layer contact each other to form the first total reflection interface, and the low refractive layer and the first high refractive layer contact each other to form the second total reflection interface.

20 Claims, 7 Drawing Sheets

(51) Int. Cl.
*H10K 59/35* (2023.01)
*H10K 102/00* (2023.01)

(52) U.S. Cl.
CPC ......... *H10K 59/873* (2023.02); *H10K 59/878* (2023.02); *H10K 2102/351* (2023.02)

(56) References Cited

U.S. PATENT DOCUMENTS

2022/0140283 A1   5/2022  Kim et al.
2024/0049576 A1*  2/2024  Tang ................ H10K 59/8791

FOREIGN PATENT DOCUMENTS

| | | | | |
|---|---|---|---|---|
| CN | 114300520 A | | 4/2022 | |
| CN | 114361364 A | * | 4/2022 | ........... H10K 59/122 |
| CN | 114420871 A | | 4/2022 | |
| CN | 114447044 A | | 5/2022 | |
| WO | WO-2020130760 A1 | * | 6/2020 | ............. H10K 71/00 |

\* cited by examiner

DISPLAY PANEL AND DISPLAY DEVICE

TECHNICAL FIELD

The present disclosure relates to the field of display technology and, more particularly, to a display panel and display device.

BACKGROUND

Organic Light Emitting Diode (OLED) is an active light-emitting display device, which has the advantages of self-illumination, wide viewing angle, high contrast, low power consumption, wide color gamut, and changeable in shape.

With the continuous development of display technology, OLED technology is increasingly used in transparent display. Transparent display is a technology that can not only display the picture, but also see through the opposite side of the screen. Transparent display technology can realize display functions such as virtual reality/augmented reality (VR/AR) and under-screen cameras.

SUMMARY

The present disclosure provides a display panel comprising a first display area and a second display area, wherein the display panel includes:
  a display baseplate, including a light-emitting area and a non-light-emitting area surrounding the light-emitting area; the light-emitting area including a first light-emitting area located in a first display area, and a second light-emitting area located in the second display area;
  a functional film layer disposed at a light outlet side of the display baseplate;
  a low refractive layer disposed at a side of the functional film layer away from the display baseplate, and an orthographic projection of the low refractive layer on the display baseplate is located within the scope of the non-light-emitting area;
  a first high refractive layer disposed at a side of the low refractive layer away from the display baseplate, the first high refractive layer at least covers the light-emitting area and a side of the low refractive layer facing the light-emitting area;
  wherein a refractive index of the first high refractive layer is larger than a refractive index of the low refractive layer, a side surface of the low refractive layer facing to the first light-emitting area and the first high refractive layer contact with each other to form a first total reflection interface, a side surface of the low refractive layer facing to the second light-emitting area and the first high refractive layer contact with each other to form a second total reflection interface; in a normal direction of the display baseplate, a minimum distance between the first light-emitting area and the first total reflection interface is different from a minimum distance between the second light-emitting area and the second total reflection interface.

In an optional implementation, in a plane where the display baseplate is located, the size of the first light-emitting area is smaller than the size of the second light-emitting area; in the normal direction of the display baseplate, the minimum distance between the first light-emitting area and the first total reflection interface is less than the minimum distance between the second light-emitting area and the second total reflection interface.

In an optional implementation, a thickness of the functional film layer in the first display area is less than a thickness of the functional film layer in the second display area.

In an optional implementation, the functional film layer comprises a second high refractive layer, and an orthographic projection of the second high refractive layer on the display baseplate does not overlap with the first display area.

In an optional implementation, the functional film layer further comprises: a first encapsulation layer disposed between the display baseplate and the second high refractive layer, and an orthographic projection of the first encapsulation layer on the display baseplate covers the first display area and the second display area;
  wherein a thickness of the first encapsulation layer in the first display area is less than or equal to a thickness of the first encapsulation layer in the second display area.

In an optional implementation, the second high refractive layer has the same refractive index as the first high refractive layer; or, a material of the second high refractive layer is the same as a material the first high refractive layer.

In an optional implementation, the functional film layer comprises a second encapsulation layer, an orthographic projection of the second encapsulation layer on the display baseplate covers the first display area and the second display area, a thickness of the second encapsulation layer in the first display area is less than a thickness of the second encapsulation layer in the second display area.

In an optional implementation, the second encapsulation layer comprises:
  a first inorganic film layer disposed at the light outlet side of the display baseplate; an organic film layer disposed at a side of the first inorganic film layer away from the display baseplate; and
  a second inorganic film layer disposed at a side of the organic film layer away from the display baseplate;
  wherein a thickness of the organic film layer in the first display area is less than a thickness of the organic film layer in the second display area.

In an optional implementation, a thickness of the functional film layer in the first display area is the same as a thickness of the functional film layer in the second display area.

In an optional implementation, the functional film layer is an encapsulation layer of the display baseplate.

In an optional implementation, the display baseplate includes:
  a substrate;
  a pixel-defining layer disposed at one side of the substrate, wherein the pixel-defining layer is configured to define an opening area; and
  a light-emitting layer disposed at a side of the pixel-defining layer away from the substrate, wherein an orthographic projection of the light-emitting layer on the substrate covers an orthographic projection of the opening area on the substrate, the light-emitting layer is configured to form the light-emitting area;
  wherein the functional film layer is disposed at a side of the light-emitting layer and a side of the pixel-defining layer away from the substrate, and a surface of the pixel-defining layer located in the non-light-emitting area away from of the substrate is located in the same plane.

In an optional implementation, the display baseplate includes:
  a substrate;

a pixel-defining layer disposed at one side of the substrate, wherein the pixel-defining layer is configured to define an opening area; and a light-emitting layer disposed at a side of the pixel-defining layer away from the substrate, wherein an orthographic projection of the light-emitting layer on the substrate covers an orthographic projection of the opening area on the substrate, the light-emitting layer is configured to form the light-emitting area;

wherein the functional film layer is disposed at a side of the light-emitting layer and the pixel-defining layer away from the substrate, and the side of the pixel-defining layer away from the substrate is provided with a groove, and the groove is located in the non-light-emitting area of the first display area.

In an optional implementation, in a normal direction of the display baseplate, the difference of, the minimum distance between the second light-emitting area and the second total reflection interface, and the minimum distance between the first light-emitting area and the first total reflection interface, is a first distance;

if a thickness of the functional film layer in the first display area is the same as a thickness of the functional film layer in the second display area, then in the normal direction of the display baseplate, the depth of the groove is larger than the first distance.

In an optional implementation, a light emitting surface of the first light-emitting area and a light emitting surface of the second light-emitting area are located in the same plane.

In an optional implementation, wherein, in a normal direction of the display baseplate, the difference of, the minimum distance between the second light-emitting area and the second total reflection interface, and the minimum distance between the first light-emitting area and the first total reflection interface, is larger than or equal to 1 micron, and less than or equal to 3 microns.

In an optional implementation, the first total reflection interface is configured for total reflection of the first display light emitted by the first light-emitting area, and the proportion of the first display light in the display light emitted by the first light-emitting area is a first proportion; the second total reflection interface is configured for total reflection of the second display light emitted by the second light-emitting area, and the proportion of the second display light in the display light emitted by the second light-emitting area is the second proportion;

wherein the absolute value of the difference between the first proportion and the second proportion is larger than or equal to 0, and less than or equal to 0.3.

In an optional implementation, the angle between the first total reflection interface and the plane where the display baseplate is located is an acute angle of which the opening is facing away from the first light-emitting area; the angle between the second total reflection interface and the plane where the display baseplate is located is an acute angle of which the opening is facing away from the second light-emitting area.

In an optional implementation, the acute angle is larger than or equal to 20° and less than or equal to 80°.

In an optional implementation, wherein the difference between a refractive index of the first high refractive layer and a refractive index of the low refractive layer is larger than 0 and less than or equal to 0.3.

The present disclosure further discloses a display device, comprising a display panel as above.

The above description is only an overview of the present disclosure of the technical solution, in order to be able to better understand the technical means of the present disclosure, and may be implemented in accordance with the content of the description, and in order to make the above and other purposes, features and advantages of the present disclosure more obvious and easy to understand, the specific embodiments of the present disclosure are hereby mentioned.

BRIEF DESCRIPTION OF THE DRAWINGS

In order to more clearly illustrate the technical solutions of the embodiments of the present application or the related art, the drawings that are required to describe the embodiments or the related art will be briefly described below. Apparently, the drawings that are described below are merely embodiments of the present application, and a person skilled in the art may obtain other drawings according to these drawings without paying creative work.

DETAILED DESCRIPTION

In order to make the purpose, technical solution and advantages of the present disclosure embodiments clearer, the following will be combined with the accompanying drawings in the present public embodiments, the technical solutions in the present disclosure embodiments are clearly and completely described, obviously, the described embodiments are part of the present disclosure embodiment, not all embodiments. Based on the embodiments in the present disclosure, all other embodiments obtained by those of ordinary skill in the art without performing creative labor fall within the scope of the protection of the present disclosure.

Figure 1:
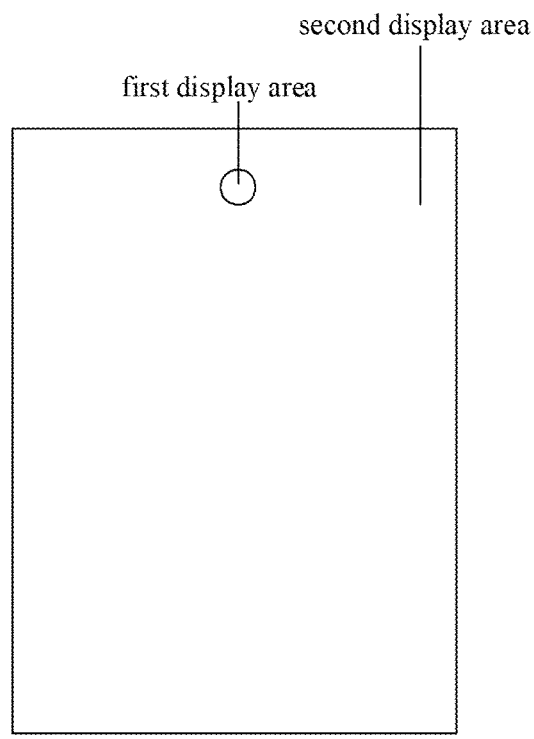
FIG. 1 schematically illustrates a planar structure of a display panel provided in the present disclosure.

The present disclosure provides a display panel, with reference to FIG. 1, which is a schematic diagram showing the planar structure of a display panel provided in the present disclosure. As shown in FIG. 1, the display panel includes a first display area and a second display area. The first display area and the second display area are configured for displaying images.

With reference to FIG. 2 to FIG. 5, which are schematic diagrams showing the cross-sectional structures of several types of display panels provided in the present disclosure. As shown in FIG. 2 to FIG. 5, the display panel includes: a display baseplate 21, including a light-emitting area A and a non-light-emitting area B surrounding the light-emitting area A; a functional film layer 22 disposed at a light outlet side of the display baseplate 21; a low refractive layer 23 disposed at a side of the functional film layer 22 away from the display baseplate 21, the orthographic projection of the low refractive layer 23 on the display baseplate 21 is located in the range of the non-light-emitting area B; and a first high refractive layer 24 disposed at a side of the low refractive layer 23 away from the display baseplate 21, the first high refractive layer 24 at least covers the light-emitting area A and a side of the low refractive layer 23 towards the light-emitting area A. The refractive index of the first high refractive layer 24 is larger than the refractive index of the low refractive layer 23.

As shown in FIG. 2 to FIG. 5, the light-emitting area A includes a first light-emitting area A1 located in the first display area, and a second light-emitting area A2 located in the second display area.

As shown in FIG. 2 to FIG. 5, the side surface of the low refractive layer 23 facing the first light-emitting area A1 contacts the first high refractive layer 24 to form a first total reflection interface s1, and the side surface of the low refractive layer 23 facing the second light-emitting area A2 contacts the first high refractive layer 24 to form a second total reflection interface s2.

As shown in FIG. 2 to FIG. 5, in the normal direction of the display baseplate 21, the minimum distance d1 between the first light-emitting area A1 and the first total reflection interface s1 is different from the minimum distance d2 between the second light-emitting area A2 and the second total reflection interface s2.

Wherein the first total reflection interface s1 is used to make the display light emitted from the first light-emitting area A1 and entering through the first high refractive layer 24 have total reflection. The second total reflection interface s2 is used to make the display light emitted from the second light-emitting area A2 and entering through the first high refractive layer 24 to have total reflection.

Figure 6:
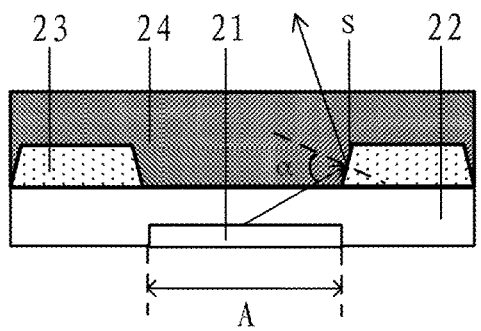
FIG. 6 schematically illustrates a first type of optical path structure provided in the present disclosure.

In the present disclosure, the first total reflection interface s1 and the second total reflection interface s2 are both total reflection interface s. Referring to FIG. 6, for the display light incident on the total reflection interface s, when the incidence angle α is larger than or equal to the critical angle of total reflection, the display light is totally reflected on the total reflection interface s, and the propagation direction of the display light after total reflection occurs towards the normal direction of the display baseplate 21, so that the incidence angle of the display light incident to the interface between the cover plate and the air may be reduced, the probability of total internal reflection of the display light at the interface between the cover plate and the air may be reduced, and the light output efficiency may be improved.

wherein the critical angle of total reflection is arcsin (n1/n2), n1 is the refractive index of the low refractive layer 23, and n2 is the refractive index of the first high refractive layer 24.

In the present disclosure, by stacking the low refractive layer 23 and the first high refractive layer 24 on the light outlet side of the display baseplate 21, the first total reflection interface s1 and the second total reflection interface s2 are formed, so that the original oblique viewing angle of the outgoing display light is deflected in the direction of the positive viewing angle, which may be improve the light output efficiency of the first display area and the second display area, especially the frontal light output efficiency.

The inventors found that by changing the minimum distance d1 between the first light-emitting area A1 and the first total reflection interface s1, the proportion of total reflection of the display light incident on the first total reflection interface s1 may be adjusted. For example, increasing the minimum distance d1 between the first light-emitting area A1 and the first total reflection interface s1 can increase the incidence angle of the display light incident on the first total reflection interface s1, increase the proportion of total reflection of the display light incident on the first total reflection interface s1, and further improve the frontal light output efficiency of the first display area.

Similarly, by changing the minimum distance d2 between the second light-emitting area A2 and the second total reflection interface s2, the proportion of total reflection of the display light incident on the second total reflection interface s2 may be adjusted. For example, increasing the minimum distance d2 between the second light-emitting area A2 and the second total reflection interface s2 can increase the incidence angle of the display light incident on the second total reflection interface s2, increase the proportion of total reflection of the display light incident on the second total reflection interface s2, and further improve the frontal light output efficiency of the second display area.

In the display baseplate 21 provided in the present disclosure, by setting the minimum distance d1 between the first light-emitting area A1 and the first total reflection interface s1 in the normal direction of the display baseplate 21 to be different from the minimum distance d2 between the second light-emitting area a2 and the second total reflection interface s2, the display difference between the first display area and the second display area in the positive or oblique viewing angle may be adjusted, which helps to improve the display uniformity of the first display area and the second display area.

For example, the number of light-emitting areas A may be more than one, as shown in FIG. 2 to FIG. 5, the plurality of light-emitting areas A may include a red light-emitting area R, a green light-emitting area G and a blue light-emitting area B, etc., the present disclosure is not limited thereto.

Light-emitting devices disposed in the light-emitting area may emit light. The light-emitting devices may be organic light emitting diodes (OLEDs), quantum dot light-emitting diodes (QLEDs), mini light-emitting diodes (Mini LED), micro light-emitting diode (Micro LED), etc., the present disclosure is not limited thereto.

In a concrete implementation, the low refractive layer 23 may be formed by patterning processes such as exposure developing, coating or inkjet printing. The first high refractive layer 24 may be formed by patterning processes such as exposure developing, coating or inkjet printing.

For example, the material of the first high refractive layer 24 may include organic materials such as acrylic, and may also include inorganic materials such as zirconia, the present disclosure is not limited thereto.

For example, the material of the low refractive layer 23 may include organic materials such as acrylic, and may also include inorganic materials such as zirconia, the present disclosure is not limited thereto.

For example, referring to FIG. 1, the first display area may be located within a transparent display area, the transparent display area may also include a light transmission area, the light transmission area is used to transmit ambient light. The second display area may be located on at least one side of the first display area.

In practical applications, an under-screen camera module may be set in the position corresponding to the transparent display area, to improve the screen-to-body ratio. When it is needed to take pictures, the transparent display area transmits light, and does not display images, and the ambient light may be collected by the under-screen camera module through the transparent display area; when there is no need to take pictures, the transparent display area displays the picture normally, and the under-screen camera module is hidden, so that a real full-screen display is realized.

In a specific implementation, in the plane where the display baseplate 21 is located, the size relationship between the first light-emitting area A1 and the second light-emitting area A2 may be determined according to actual requirements. For example, the size of the first light-emitting area A1 may be larger than, equal to, or less than the size of the second light-emitting area A2, the present disclosure is not limited thereto.

In order to increase a light-transmitting area of the transparent display area and improve the ambient light transmittance, in the plane where the display baseplate 21 is located, the size of the first light-emitting area A1 may be smaller than the size of the second light-emitting area A2, as shown in FIG. 2 to FIG. 5, in a specific implementation, the first light-emitting area A1 and the second light-emitting area A2 satisfying the above dimensional relation may have the same luminous color.

Figure 7:
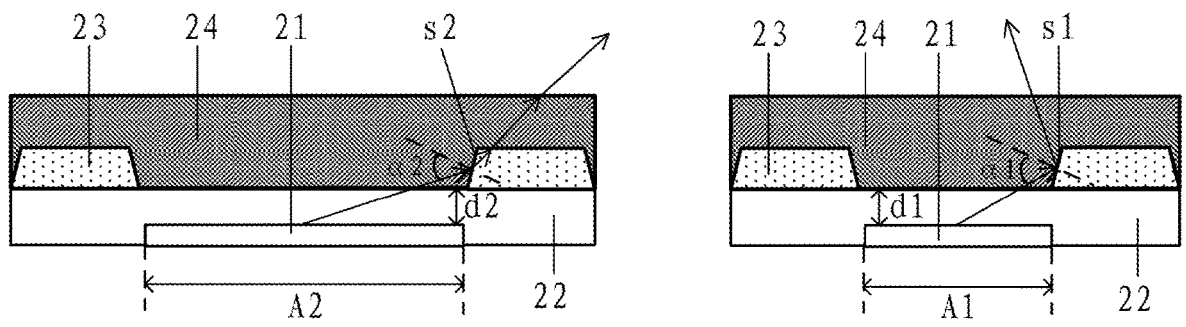
FIG. 7 schematically illustrates a second type of optical path structure provided in the present disclosure.

Referring to FIG. 7, it shows that in the plane where the display baseplate 21 is located, the size of the first light-emitting area A1 is smaller than the size of the second light-emitting area A2. In the normal direction of the display baseplate 21, if the minimum distance d1 between the first light-emitting area A1 and the first total reflection interface s1 and the minimum distance d2 between the second light-emitting area A2 and the second total reflection interface s2 are the same, the display light emitted from the center of the first light-emitting area A1 incident to the first total reflection interface s1 (as shown in part b of FIG. 7) and a from the display light emitted from the center of the second light-emitting area A2 incident to the second total reflection interface s2 (as shown in part a in FIG. 7) are shown.

As shown in FIG. 7, since the first light-emitting area A1 is smaller in size than the second light-emitting area A2, in the normal direction of the display baseplate 21, when the minimum distance d1 between the first light-emitting area A1 and the first total reflection interface s1, and the minimum distance d2 between the second light-emitting area A2 and the second total reflection interface s2 are the same, the incidence angle α1 that the display light emitted by the first light-emitting area A1 incident to the first total reflection interface s1 is larger, and total reflection is more easy to occur, and more display light that are originally emergent in an oblique angle can be deflected to a positive angle direction, and the total reflection ratio is higher, as a result, the brightness attenuation amplitude of the first display area in the oblique angle direction is larger than the brightness attenuation amplitude of the second display area in the oblique angle direction, so that the displayed image of the first display area in the oblique angle direction and the displayed image of the second display area in the oblique angle direction are significantly different.

Figure 11:
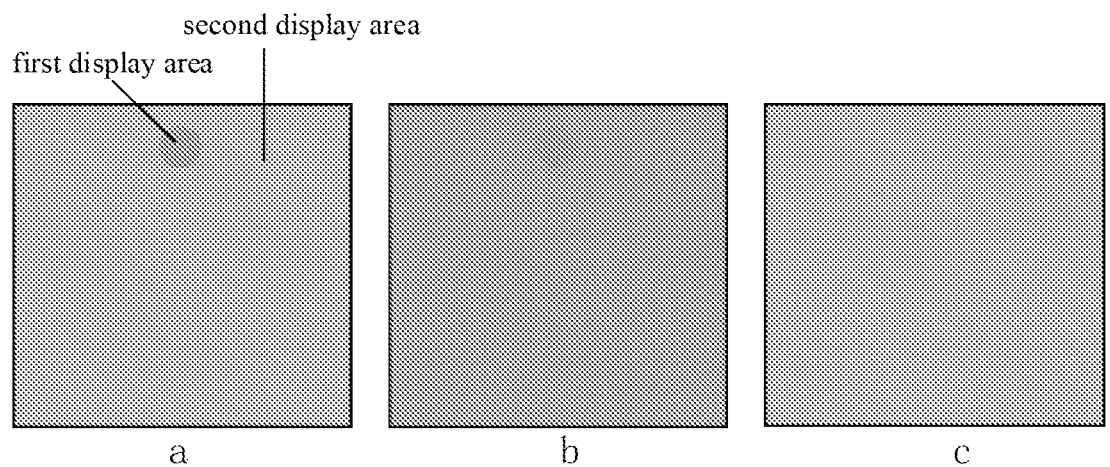
FIG. 11 schematically shows the display simulation screen of several display panels in an oblique viewing angle.

Referring to part a in FIG. 11, it shows the display simulation image of the display panel at a 45° oblique viewing angle in FIG. 7. It can be seen that there is a significant difference between the display of the first display area and the second display area at a 45° oblique viewing angle.

Figure 10:
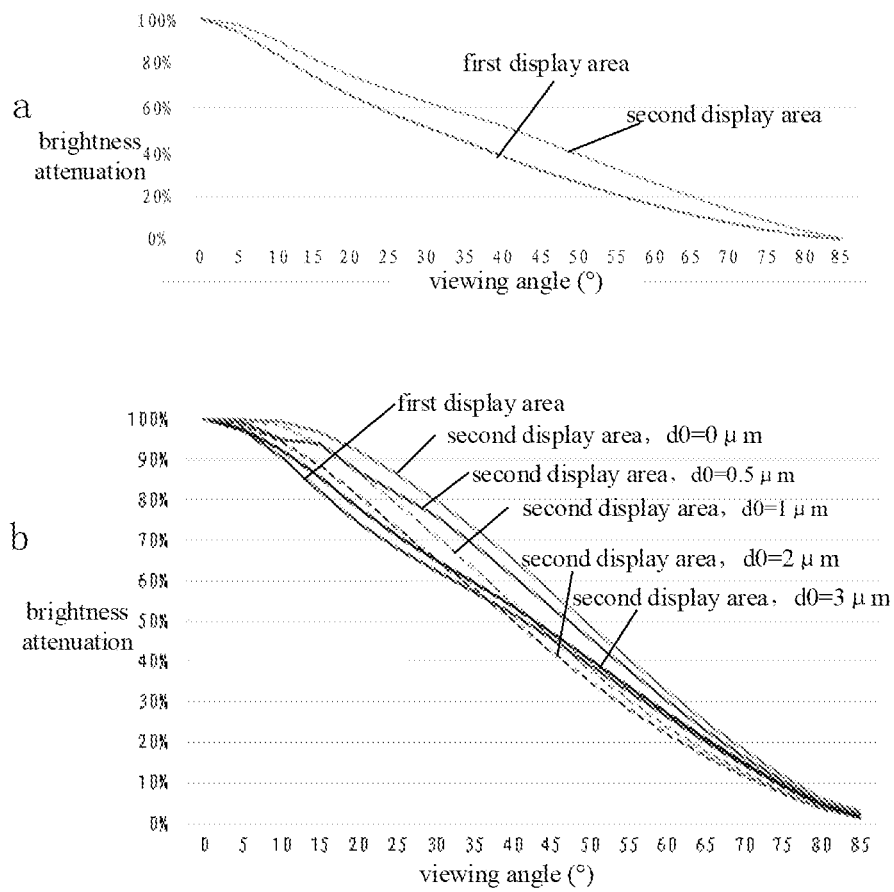
FIG. 10 schematically shows the simulation curves of brightness attenuation of the first display area and the second display area in each viewing angle of several display panels.

Referring to part A in FIG. 10, which is the brightness attenuation simulation curves in each viewing angle direction of the first and second display areas in the display panel shown in FIG. 7. As may be seen from the part A in FIG. 10, the brightness attenuation amplitude of the first display area in the oblique angle direction is larger than the brightness attenuation amplitude of the second display area in the oblique viewing angle direction. Moreover, even if the brightness of the first display area and the brightness of the second display area are adjusted to be consistent in the direction of the positive viewing angle by gamma correction, there will still be a large difference in brightnesses in the oblique viewing angle.

In order to improve the display uniformity of the first display area and the second display area under the oblique viewing angle, optionally, as shown in FIG. 2 to FIG. 5, in the plane where the display baseplate 21 is located, the size of the first light-emitting area A1 is smaller than the size of the second light-emitting area A2; in the normal direction of the display baseplate 21, the minimum distance d1 between the first light-emitting area A1 and the first total reflection interface s1 is less than the minimum distance d2 between the second light-emitting area A2 and the second total reflection interface s2.

Figure 8:
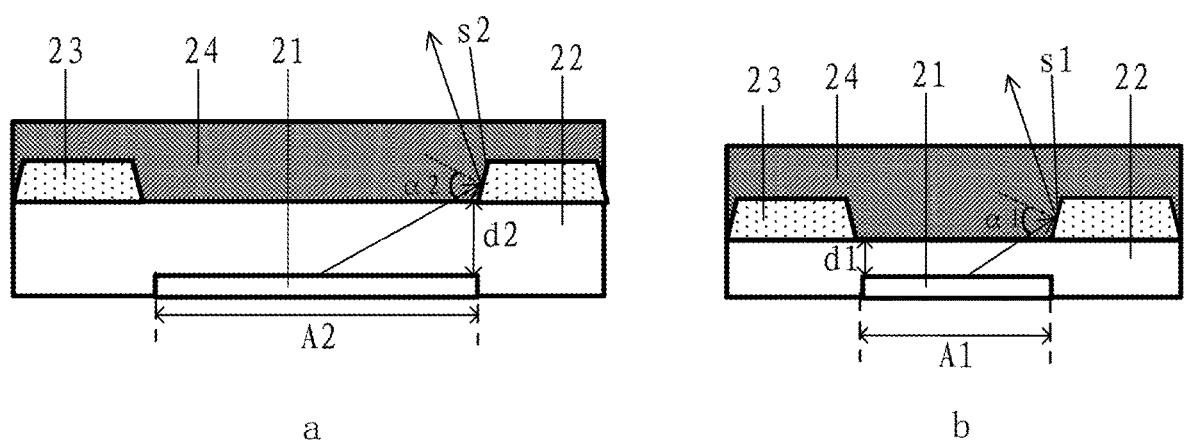
FIG. 8 schematically illustrates a third type of optical path structure provided in the present disclosure.
Figure 9:
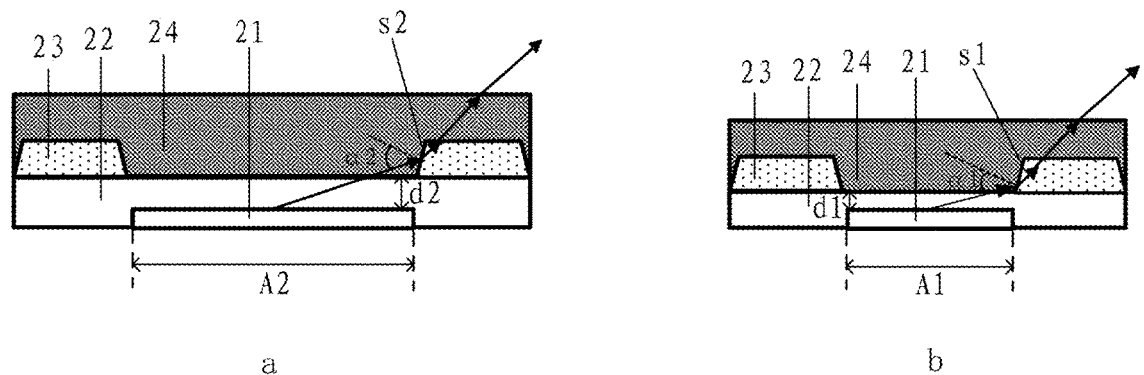
FIG. 9 schematically illustrates a fourth type of optical path structure provided in the present disclosure.

Increasing the minimum distance between the light-emitting area A and the total reflection interface s may increase the incidence angle of the display light on the total reflection interface s, so that, refer to FIG. 8 or FIG. 9, since the second light-emitting area A2 is larger than the first light-emitting area A1, the incident angle of the second display light on the second total reflection interface s2 is less than the incident angle of the first display light on the first total reflection interface s1, the angle difference above may be compensated by setting the minimum distance d2 between the second light-emitting area A2 and the second total reflection interface s2 to be larger than the minimum distance d1 between the first light-emitting area A1 and the first total reflection interface s1, such that the incidence angle α1 of the first display light on the first total reflection interface s1 and the incidence angle α2 of the second display light on the second total reflection interface s2 are as consistent as possible, which may reduce the proportion difference of the display light that is fully reflected in the first display area and in the second display area, and then compensate for the brightness attenuation amplitude of the first display area in the oblique viewing angle direction, and improve the display uniformity of the first display area and the second display area in the oblique viewing angle direction.

Figure 2:
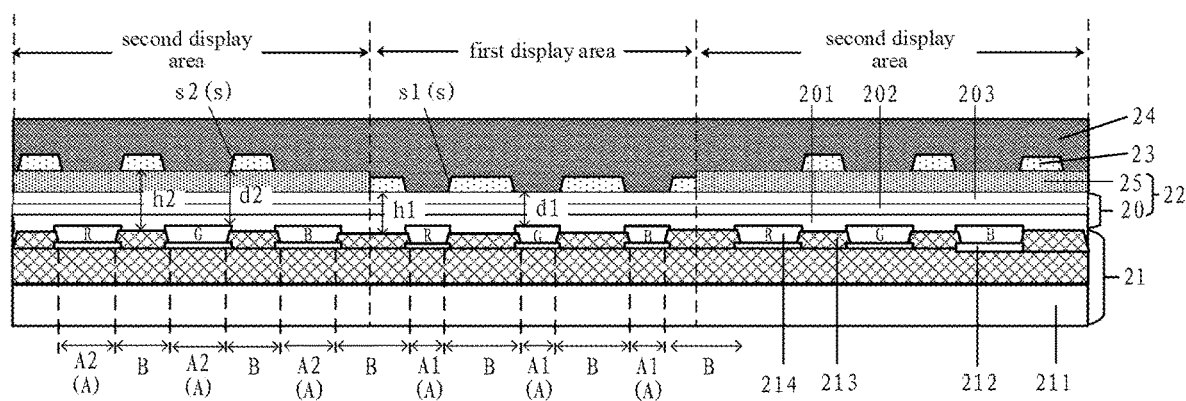
FIG. 2 schematically illustrates a cross-sectional structure of a first type of display panel provided in the present disclosure.
Figure 3:
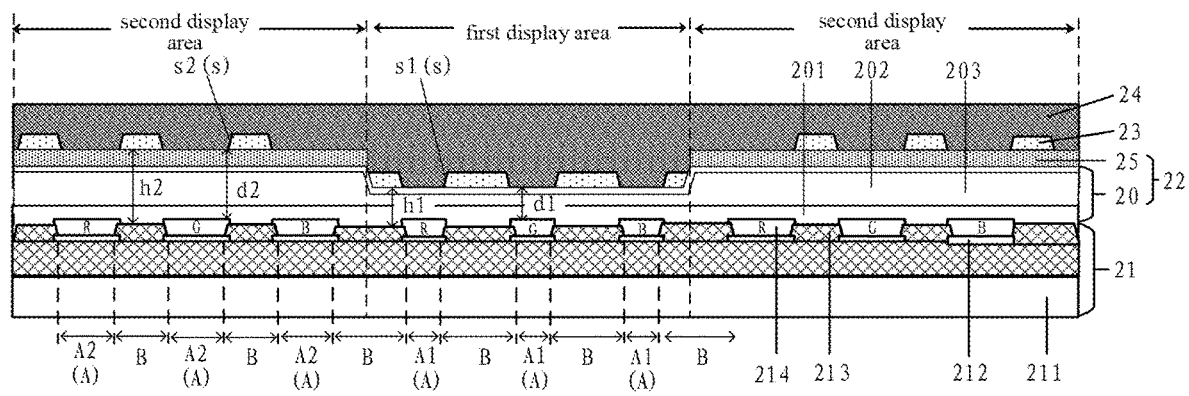
FIG. 3 schematically illustrates a cross-sectional structure of a second type of display panel provided in the present disclosure.
Figure 4:
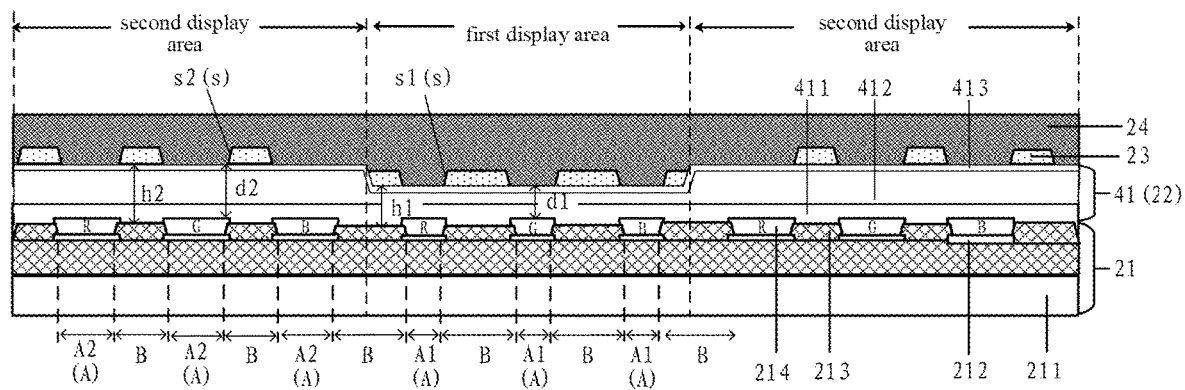
FIG. 4 schematically illustrates a cross-sectional structure of a third type of display panel provided in the present disclosure.

In the normal direction of the display baseplate 21, in order to make a minimum distance d1 between the first light-emitting area A1 and the first total reflection interface s1 less than the minimum distance d2 between the second light-emitting area A2 and the second total reflection interface s2, optionally, as shown in FIG. 2 to FIG. 4, the thickness h1 of the functional film layer 22 in the first display area is less than the thickness h2 of the functional film layer 22 in the second display area.

Wherein, the thickness of the functional film layer 22 in the first display area h1, refers to the maximum distance between a surface of the functional film layer 22 in the first display area close to the display baseplate 21 and a surface away from the display baseplate 21. The thickness of the functional film layer 22 in the second display area h2, refers to the maximum distance between a surface of the functional film layer 22 in the second display area close to the display baseplate 21 and a surface away from the display baseplate 2.

In order to achieve that the thickness h1 of the functional film layer 22 in the first display area is less than the thickness h2 of the functional film layer 22 in the second display area, the present disclosure provides the following implementation.

In the first implementation, as shown in FIG. 2 and FIG. 3, the functional film layer 22 includes a second high refractive layer 25, and the orthographic projection of the second high refractive layer 25 on the display baseplate 21 does not overlap with the first display area.

By setting a second high refractive layer 25 in the second display area, and not setting in the first display area, the surface of one side of the functional film layer 22 in the second display area away from the display baseplate 21 can be increased. The minimum distance d2 between the second light-emitting area A2 and the second total reflection interface s2 may be increased, so that the thickness h2 of the functional film layer 22 in the second display area is larger than the thickness h1 of the functional film layer 22 in the first display area, and then realize that the minimum distance d2 between the second light-emitting area A2 and the second total reflection interface s2 is larger than the minimum distance d1 between the first light-emitting area A1 and the first total reflection interface s1.

Referring to part a in FIG. 7 and part a in FIG. 8, the incident angle of the display light incident on the second total reflection interface s2 may be increased by increasing the minimum distance d2 between the second light-emitting area A2 and the second total reflection interface s2.

Referring to part a and part b in FIG. 8, by increasing the incidence angle of the display light on the second total reflection interface s2, the small incidence angle of the second display light on the second total reflection interface s2 caused by the large size of the second light-emitting area A2 may be compensated, so that the incidence angle α1 of the first display light on the first total reflection interface s1 may be compensated as consistent as possible with the incidence angle α2 of the second display light on the second total reflection interface s2, thereby reducing the proportion difference of display light that have total reflection between the first display area and the second display area, and improving the display uniformity of the first display area and the second display area in the oblique viewing angle direction.

Optionally, as shown in FIG. 2 and FIG. 3, the functional film layer 22 may further include: a first encapsulation layer 20 disposed between the display baseplate 21 and a second high refractive layer 25, the orthographic projection of the first encapsulation layer 20 on the display baseplate 21 covers the first display area and the second display area.

For example, as shown in FIG. 2, the thickness of the first encapsulation layer 20 in the first display area may be equal to the thickness of the first encapsulation layer 20 in the second display area.

For example, as shown in FIG. 3, the thickness of the first encapsulation layer 20 in the first display area is smaller than the thickness of the first encapsulation layer 20 in the second display area.

By setting the thickness of the first encapsulation layer 20 in the second display area to be larger than the thickness of the first encapsulation layer 20 in the first display area, the difference between the minimum distance d2 between the second light-emitting area A2 and the second total reflection interface s2 and the minimum distance d1 between the first light-emitting area A1 and the first total reflection interface s1 may be further increased.

Optionally, as shown in FIG. 2 and FIG. 3, the first encapsulation layer 20 includes: a first inorganic layer 201, an organic layer 202 and a second inorganic layer 203 stacked on the light outlet side of the display baseplate 21.

In order to achieve that the thickness of the first encapsulation layer 20 in the first display area is less than the thickness of the first encapsulation layer 20 in the second display area, as shown in FIG. 3, the thickness of the organic layer 202 in the first display area may be set to be less than the thickness of the organic layer 202 in the second display area. By setting the organic layers 202 with different thicknesses in the first display area and the second display area, the thickness differentiation of the first encapsulation layer 20 can be achieved, and therefore can reduce the process complexity and help to achieve a large thickness difference.

In a specific embodiment, the first inorganic layer 201 and the second inorganic layer 203 may be formed by vapor deposition method, and the present disclosure is not limited thereto.

In a specific implementation, the organic layer 202 may be formed by a printing or exposure process. For example, the organic layer 202 of FIG. 3 may be formed by a twice-printing process, using a first printing process to form an organic film with a flat surface or the same thickness in the first display area and the second display area, and then using a second printing process to form an organic film in the second display area, so that organic layers 202 with different thicknesses may be formed in the first display area and the second display area.

Optionally, the refractive index of the second high refractive layer 25 is larger than the refractive index of the low refractive layer 23.

Further, the second high refractive layer 25 may have the same refractive index as the first high refractive layer 24. In this way, the display light may be prevented from changing the direction of propagation at the interface of the second high refractive layer 25 and the first high refractive layer 24, and then improve the brightness uniformity of each viewing angle.

For example, the material of the second high refractive layer 25 may include organic materials such as acrylic, and may also include inorganic materials such as zirconia, which are not limited herein.

Optionally, the material of the second high refractive layer 25 and the material of the first high refractive layer 24 are the same or different, and the present disclosure is not limited thereto.

In a specific implementation, the second high refractive layer 25 may be formed by patterning processes such as exposure development, coating or inkjet printing.

In the second implementation, as shown in FIG. 4, the functional film layer 22 includes a second encapsulation layer 41, the orthographic projection of the second encapsulation layer 41 on the display baseplate 21 covers the first display area and a second display area, the thickness of the second encapsulation layer 41 in the first display area is less than the thickness of the second encapsulation layer 41 in the second display area.

In the present implementation, by setting the thickness of the second encapsulation layer 41 in the second display area to be larger than the thickness of the second encapsulation layer 41 in the first display area, the thickness of the functional film layer 22 in the second display area h2 can be larger than the thickness h1 of the functional film layer 22 in the first display area, and then the minimum distance d2 between the second light-emitting area A2 and the second total reflection interface s2 is larger than the minimum distance d1 between the first light-emitting area A1 and the first total reflection interface s1.

Optionally, as shown in FIG. 4, the second encapsulation layer 41 includes: a first inorganic film layer 411 disposed at the light outlet side of the display baseplate 21, an organic film layer 412 disposed at a side of the first inorganic film layer 411 away from the display baseplate 21, and a second inorganic film layer 413 disposed at a side of the organic film layer 412 away from the display baseplate 21.

In order to achieve that the thickness of the second encapsulation layer 41 in the first display area is less than the thickness of the second encapsulation layer 41 in the second display area, the thickness of the organic film layer 412 in the first display area may be set to be less than the thickness of the organic film layer 412 in the second display area.

By setting the organic film layers 412 with different thicknesses in the first display area and the second display area, the thickness differentiation of the second encapsulation layer 41 can be achieved, and thereby reducing the process complexity and achieving a large thickness difference.

In a specific embodiment, the first inorganic film layer 411 and the second inorganic film layer 413 may be formed by vapor deposition method, and the present disclosure is not limited thereto.

In specific implementations, the organic films may be formed using printing or exposure processes. For example, the organic film layer 412 may be formed by a twice-printing process, using the first printing process to form an organic film with a flat surface or the same thickness in the first display area and the second display area, and then using a second printing process to form an organic film in the second display area, so that organic films of different thicknesses 412 may be formed in the first display area and the second display area.

In a specific implementation, the structure of the display baseplate 21 may be implemented in a variety of ways.

As shown in FIG. 2 to FIG. 5, the display baseplate 21 may include a substrate 211, a pixel-defining layer 213 and a light-emitting layer 214. The pixel-defining layer 213 is disposed at one side of the substrate 211, the pixel-defining layer 213 is used to define an opening area. The light-emitting layer 214 is disposed at a side of the pixel-defining layer 213 away from the substrate 211, the orthography projection of the light-emitting layer 214 on the substrate 211 covers the orthographic projection of the opening area on the substrate 211, the light-emitting layer 214 is configured to form a light-emitting area A. The functional film layer 22 is disposed at a side of the light-emitting layer 214 and a side of the pixel-defining layer 213 away from the substrate 211.

In order to drive the light-emitting layer 214 to emit light, the display baseplate 21 may further include a first electrode layer 212 disposed between the substrate 211 and the pixel-defining layer 213, and a second electrode layer (not shown) disposed at a side of the light-emitting layer 214 away from the substrate 211. Wherein the first electrode layer 212 may include a plurality of separately-disposed first electrodes, the orthographic projection of the first electrode layer 212 on the substrate 211 covers the orthographic projection of the opening area on the substrate 211.

Exemplary, as shown in FIG. 2 to FIG. 4, the surface of a side of the pixel-defining layer 213 $d$ located within the non-light-emitting area B away from the substrate 211 is located in the same plane.

In FIG. 2, the surface of a side of the pixel-defining layer 213 $d$ located within the non-light-emitting area B away from the substrate 211 is located in the same plane, the thickness of the first encapsulation layer 20 in the first display area is equal to the thickness of the first encapsulation layer 20 in the second display area, in this case, the surface of the first encapsulation layer 20 away from the first display area and the surface of the first encapsulation layer 20 away from the second display area are located in the same plane, the thickness of the second high refractive layer 25, may be equal to the difference between the minimum distance d2 between the second light-emitting area A2 and the second total reflection interface s2 and the minimum distance d1 between the first light-emitting area A1 and the first total reflection interface s1.

In FIG. 4, the surface of a side of the pixel-defining layer 213 located in the non-light-emitting area B away from the substrate 211 is located in the same plane, and the thickness of the second encapsulation layer 41 in the first display area is less than the thickness of the second encapsulation layer 41 in the second display area, in this case, the thickness difference of the thickness of the second encapsulation layer 41 in the second display area and the thickness of the second encapsulation layer 41 in the first display area may be equal to the difference of the minimum distance d2 between the second light-emitting area A2 and the second total reflection interface s2 and the minimum distance d1 between the first light-emitting area A1 and the first total reflection interface s1.

Figure 5:
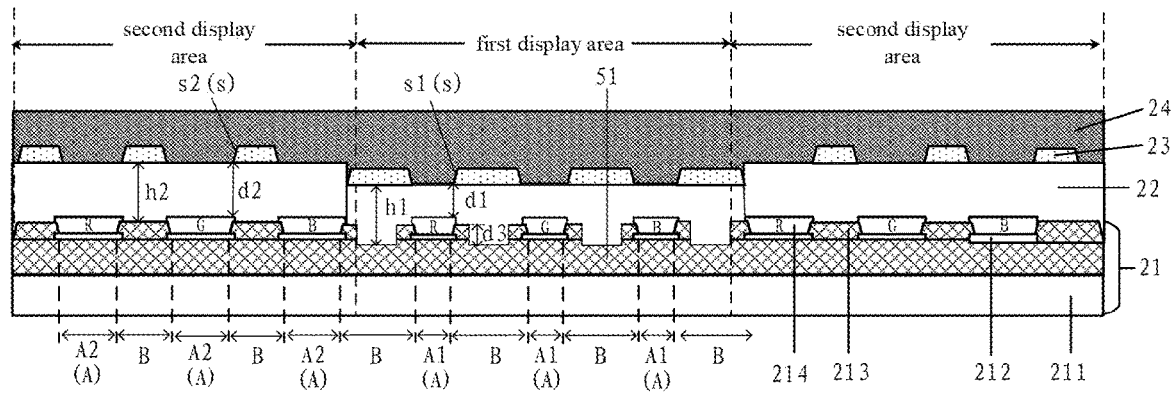
FIG. 5 schematically illustrates a cross-sectional structure of a fourth type of display panel provided in the present disclosure.

Optionally, as shown in FIG. 5, the pixel-defining layer 213 is provided with a groove 51 at one side away from the substrate 211, and the groove 51 is located within the non-light-emitting area B of the first display area.

By setting the groove 51 on the surface of the pixel-defining layer 213 within the first display area, the surface height at a side of the functional film layer 22 in the first display area away from the display baseplate 21 may be reduced, and the minimum distance d1 between the first light-emitting area A1 and the first total reflection interface s1 may be reduced, which further increases the difference of the minimum distance d2 between the second light-emitting area A2 and the second total reflection interface s2 and the minimum distance d1 between the first light-emitting area A1 and the first total reflection interface s1.

Referring to part b in FIG. 7 and part b in FIG. 9, reducing the minimum distance d1 between the first light-emitting area A1 and the first total reflection interface s1 can reduce the incidence angle of the display light on the first total reflection interface s1.

Referring to part a and part b in FIG. 9, by reducing the incident angle of the display light on the first total reflection interface s1, the large incident angle of the first display light on the first total reflection interface s1 due to the small-sized first light-emitting area A1 may be compensated. The incidence angle $\alpha1$ of the first display light on the first total reflection interface s1 and the incidence angle $\alpha2$ of the second display light on the second total reflection interface s2 is as consistent as possible, such that reducing the proportion difference of the display light that have total reflection in the first display area and the second display area, and improving the display uniformity of the first display area and the second display area in the oblique viewing angle direction.

When the pixel-defining layer 213 is provided with a groove 51 at a side away from the substrate 211, and the groove 51 is located in the non-light-emitting area B of the first display area, the thickness of the functional film layer 22 in the first display area h1 and the functional film layer 22 in the second display area h2 may be the same, as shown in FIG. 5.

Optionally, the functional film layer 22 is an encapsulation layer of the display baseplate 21.

Suppose that in the normal direction of the display baseplate 21, the difference of the minimum distance d2 between the second light-emitting area A2 and the second total reflection interface s2 and the minimum distance d1 between the first light-emitting area A1 and the first total reflection interface s1 is the first distance d0, that is, d0=d2−d1.

As shown in FIG. 5, the thickness h1 of the functional film layer 22 in the first display area is the same as the thickness h2 of the functional film layer 22 in the second display area, and the depth d3 of the groove 51 may be larger than the first distance do in the normal direction of the display baseplate 21. Since the groove 51 may be filled in the subsequent film manufacturing process, by setting the depth d3 of groove 51 to be larger than the first distance d0, the difference of the first distance do can finally be ensured.

In a specific implementation, the groove 51 on the surface of the pixel-defining layer 213 may be formed by an exposure process. The groove wall of the groove 51 defines an opening area.

Referring to part b in FIG. 11, the display simulation image of the display panel shown in FIG. 2 at an oblique viewing angle of 45° is shown. It can be seen that the display difference between the first display area and the second display area in the oblique viewing angle is significantly improved. Referring to part c in FIG. 11, the display simulation image of the display panel shown in FIG. 5 at an oblique viewing angle of 45° is shown. It can be seen that the display difference between the first display area and the second display area in the oblique viewing angle is significantly improved.

In a specific embodiment, referring to FIG. 2 to FIG. 5, the thickness h1 of the functional film layer 22 in the first display area and the thickness h2 of the functional film layer 22 in the second display area may be the same or different, and the present disclosure is not limited thereto.

Optionally, as shown in FIG. 2 to FIG. 5, the light-emitting surface of the first light-emitting area A1 and the light-emitting surface of the second light-emitting area A2 are located in the same plane. In this way, the wiring difficulty of the first electrode layer 212 and the second electrode layer may be reduced.

When the light-emitting surface of the first light-emitting area A1 and the light-emitting surface of the second light-emitting area A2 are located in the same plane, in order to achieve the minimum distance d1 between the first light-emitting area A1 and the first total reflection interface s1 is less than the minimum distance d2 between the second light-emitting area A2 and the second total reflection interface s2, referring to FIG. 2 to FIG. 5, the upper surface of the functional film layer 22 in the first display area is lower than the upper surface of the functional film layer 22 in the second display area. The low refractive layer 23 or total reflection interface is located at a surface of the functional film layer 22 away from the display baseplate 21.

It should be noted that the light-emitting surface of the first light-emitting area A1 and the light-emitting surface of the second light-emitting area A2 may not be located in the same plane, and the present disclosure is not limited thereto.

Referring to part b in FIG. 10, the brightness attenuation simulation curves of the first and second display areas corresponding to several first distances in each viewing angle direction are shown. It can be seen that when the first distance d0 is larger than or equal to 1 micron meters and less than or equal to 3 micron meters, the brightness of the first display area and the second display area are closer in the oblique viewing angle range of 30° to 45°. When the first distance d0 is less than 1 micron meter, for example, 0.5 micro meters as in part b, there is still a large difference between the brightness of the first display area and the brightness of the second display area. When the first distance d0 is larger than 3 micron meters, the flatness of the first display area cannot be guaranteed, which may lead to poor image distortion.

Thus, in order to ensure the flatness of the first display area, and to reduce the brightness difference between the first display area and the second display area under the oblique viewing angle, optionally, for the normal direction of the display baseplate 21, the minimum distance d2 between the second light-emitting area A2 and the second total reflection interface s2, and the minimum distance d1 between the first light-emitting area A1 and the first total reflection interface s1, the absolute value of the difference of d2 and d1 is larger than or equal to 1 micron meter and less than or equal to 3 micron meters. That is, $1\ \mu m \leq |d2-d1| \approx 3\ \mu m$.

Wherein, the first total reflection interface s1 is used to fully reflect the first display light emitted by the first light-emitting area A1, and the proportion of the first display light in the display light emitted by the first light-emitting area A1 is the first proportion. The second total reflection interface s2 is used to fully reflect the second display light emitted by the second light-emitting area A2, and the proportion of the second display light in the display light emitted by the second light-emitting area A2 is the second proportion.

Optionally, the absolute value of the difference between the first proportion and second proportion is larger than or equal to 0, and less than or equal to 0.3.

Since the total reflection interface can deflect the display light that originally came out from the oblique angle to the positive angle of view (as shown in FIG. 6), the total reflection interface may be set to reduce the amount of light emitted in the oblique viewing angle. When the absolute value of the difference between the first proportion and second proportion is too large, the display of the first display area and the second display area in the oblique viewing angle may have a significant difference.

By setting the absolute value of the difference between the first proportion and second proportion to be larger than or equal to 0 and less than or equal to 0.3, it can ensure that the brightness difference between the first display area and the second display area in the oblique viewing angle direction is small, and therefore improving the display uniformity of the first display area and the second display area in the oblique viewing angle direction.

Optionally, the angle between the first total reflection interface s1 and the plane where the display baseplate 21 is located is an acute angle whose opening is opposite to the first light-emitting area A1.

By setting the angle between the first total reflection interface s1 and the plane where the display baseplate 21 is located as an acute angle whose opening is opposite to the light-emitting area A, more display light incident on the first total reflection interface s1 may be fully reflected, which may further improve the light output efficiency of the first display area, especially the light output efficiency at the front side.

Optionally, the angle between the second total reflection interface s2 and the plane where the display baseplate 21 is located is an acute angle whose opening is opposite to the second light-emitting area A2.

By setting the angle between the second total reflection interface s2 and the plane where the display baseplate 21 is located as an acute angle whose opening is opposite to the light-emitting area A, more display light incident on the second total reflection interface s2 may be fully reflected, which may further improve the light output efficiency of the second display area, especially the light output efficiency at the front side.

Optionally, the acute angle θ is larger than or equal to 20° and less than or equal to 80°. Further, the acute angle θ may be larger than or equal to 30° and less than or equal to 70°, and the acute angle θ may also be larger than or equal to 40° and less than or equal to 70%.

Optionally, the difference between the refractive index of the first high refractive layer 24 and the low refractive layer 23 is larger than 0, and less than or equal to 0.3.

Optionally, the refractive index of the low refractive layer 23 is larger than or equal to 1.4, and less than or equal to 1.6. Further, the refractive index of the low refractive layer 23 may be larger than or equal to 1.47, and less than or equal to 1.5.

Optionally, the refractive index of the first high refractive layer 24 is larger than or equal to 1.6, and less than or equal to 1.8. Further, the refractive index of the first high refractive layer 24 is larger than or equal to 1.7, and less than or equal to 1.75.

The present disclosure provides a display device, including a display panel provided above.

Since the display device includes the above display panel, those skilled in the art may understand that the display device has the advantages of the display panel provided in the present disclosure, which will not be repeated herein.

It should be noted that the display device in the present embodiment may be: display panels, electronic paper, mobile phones, tablets, televisions, laptops, digital photo frames, virtual reality devices, augmented reality devices, under-screen camera devices, and navigators and other products or components with 2D or 3D display functions.

The present disclosure provides a method for manufacturing a display panel, referring to FIG. 1 to FIG. 5, the display panel includes a first display area and a second display area, the method for manufacturing the display panel preparation method may include:

Step S01: providing a display baseplate. The display panel includes a light-emitting area and a non-light-emitting area surrounding the light-emitting area: the light-emitting area includes a first light-emitting area located in the first display area, and a second light-emitting area located in the second display area.

Step S02: forming a functional film layer at a light outlet side of the display baseplate.

Step S03: forming a low refractive layer at one side of the functional film layer away from the display baseplate, and the orthographic projection of the low refractive layer on the display baseplate is within the non-light-emitting area.

Step S04: forming a first high refractive layer at one side of the low refractive layer away from the display baseplate, and the first high refractive layer at least covers the light-emitting area and the side of the low refractive layer towards the light-emitting area.

Wherein, the refractive index of the first high refractive layer is larger than the refractive index of the low refractive layer, the side surface of the low refractive layer facing the first light-emitting area contacts with the first high refractive layer to form a first total reflection interface, and the side surface of the low refractive layer facing the second light-emitting area contacts with the first high refractive layer to form a second total reflection interface; in the normal direction of the display baseplate, the minimum distance between the first light-emitting area and the first total reflection interface is different from the minimum distance between the second light-emitting area and the second total reflection interface.

Using the method for manufacturing the display panel, in the present disclosure, a display panel provided by any of the above may be manufactured.

Figure 12:
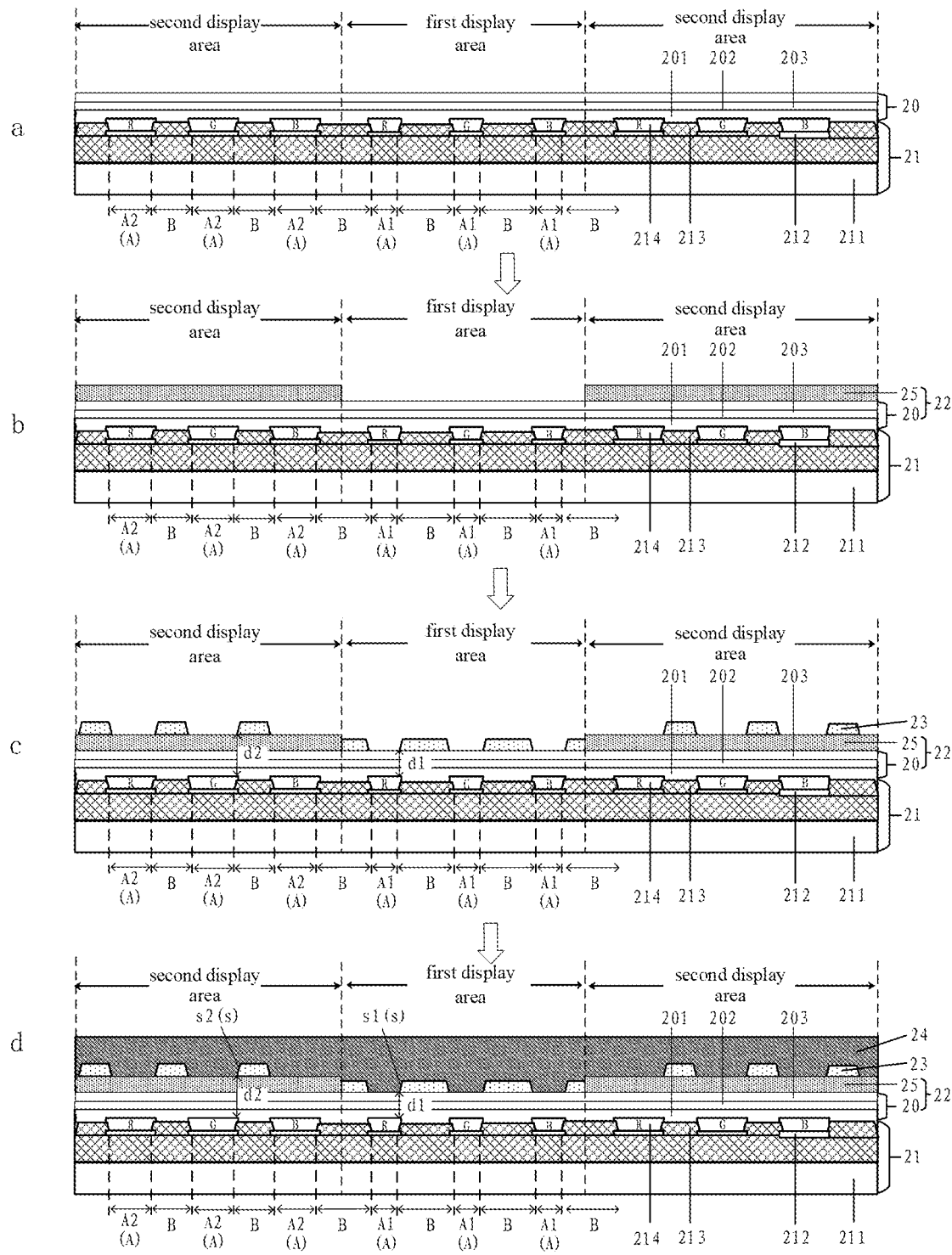
FIG. 12 schematically illustrates a schematic diagram of the preparation process of the first type of display panel provided in the present disclosure.
Figure 13:
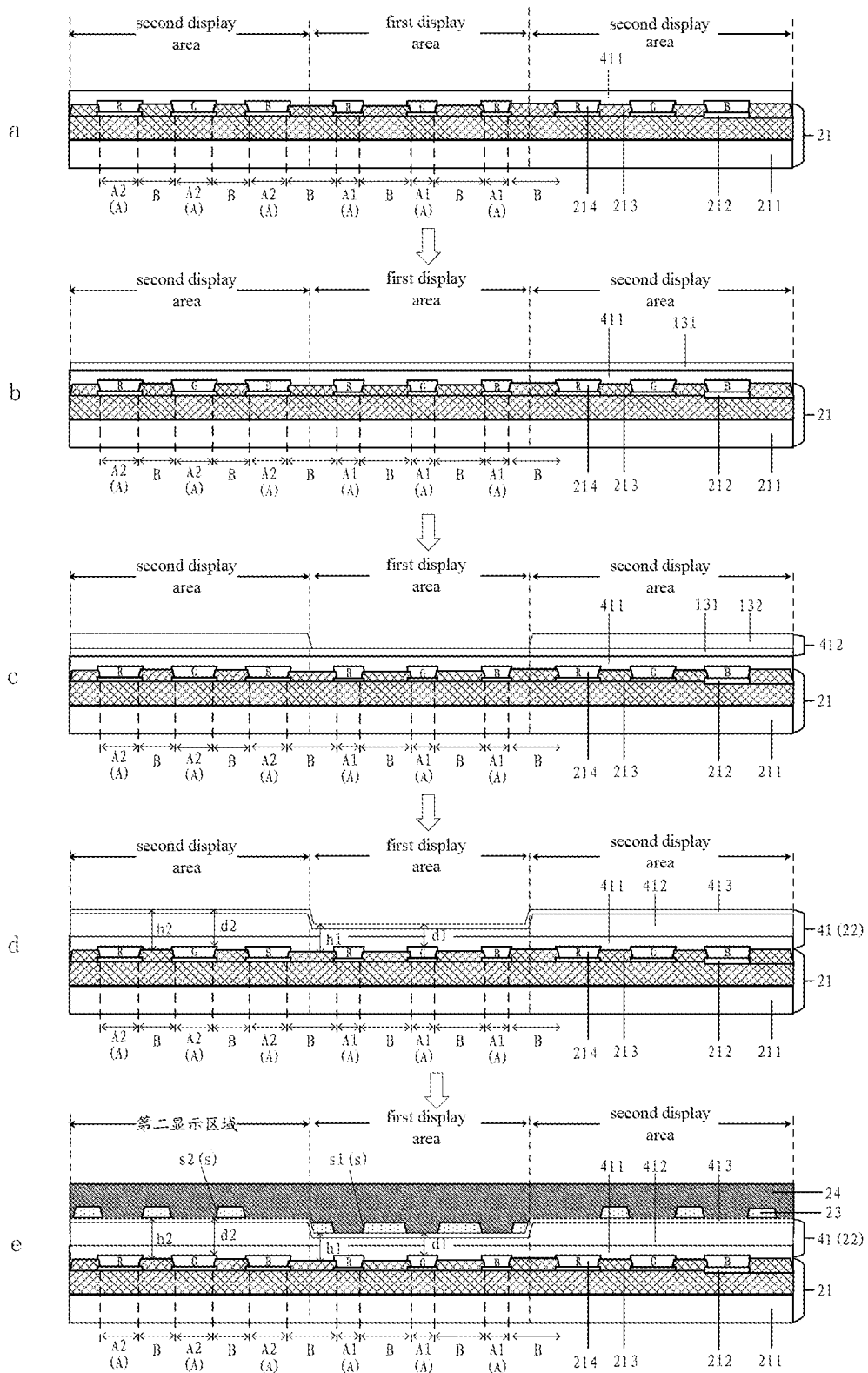
FIG. 13 schematically illustrates a schematic diagram of the preparation process of a third type of display panel provided in the present disclosure.

Refer to FIG. 12, it is a schematic diagram of the manufacturing process of the display panel in FIG. 2, the manufacturing process may include the following steps:

Step 01: providing a display baseplate 21, and a first encapsulation layer 20 is disposed at the light outlet surface of the display baseplate 21, as shown in part a in FIG. 12;

Step 02: forming a second high refractive layer 25 at one side of the first encapsulation layer 20 away from the display baseplate 21 in the second display area; as shown in part b in FIG. 12;

Step 03: forming a low refractive layer 23 at a side of the second high refractive layer 25 and the first encapsulation layer 20 away from display baseplate 21; as shown in part c in FIG. 12;

Step 04: forming a first high refractive layer 24 at a side of the low refractive layer 23 away from the display baseplate 21, as shown in part d of FIG. 12;

Refer to FIG. 13, it is a schematic diagram of the manufacturing process of the display panel shown in FIG. 4, which may include the following steps:

Step 11: providing a display baseplate 21, and a first inorganic film layer 411 is disposed at a light outlet surface of the display baseplate 21, as shown in part a in FIG. 13;

Step 12: using a printing process for the first time, forming a flat organic film 131 at one side of the first inorganic film layer 411 away from the display baseplate 21; as shown in part b in FIG. 13;

Step 13: using a printing process for the second time, forming an organic film 132 at one side of the organic film 131 in the second display area away from the display baseplate 21, and the organic film layer 412 is obtained: as shown in part e in FIG. 13;

Step 14: forming a second inorganic film 413 at a side of the organic film layer 412 away from the display baseplate 21; as shown in part d in FIG. 13;

Step 15: at a side of the second inorganic film layer 413 away from the display baseplate 21, forming a low refractive layer 23 and a first high refractive layer 24 sequentially, as shown in part e of FIG. 13.

Each embodiment in the present specification is described in a progressive manner, each embodiment highlights the difference from other embodiments, and the same similar parts between each embodiment can refer to each other.

Finally, it should be noted that herein, relational terms such as first and second, etc., are only used to distinguish an entity or operation from another, and do not necessarily require or imply any such actual relationship or order between these entities or operations. Further, the term "including", "including" or any other variation thereof is intended to cover non-exclusive inclusions so that a process, method, good or equipment comprising a series of elements includes not only those elements, but also other elements not expressly listed or elements inherent in such process, method, good or equipment. Without further restrictions, the elements qualified by the statement "including a . . . " do not exclude the existence of other identical elements in the process, method, goods or equipment comprising the elements.

The above is a display panel and display device provided by the present disclosure in detail, and specific examples are applied herein to explain the principles and embodiments of the present disclosure, and the above embodiments are only used to help understand the methods of the present disclosure and its core ideas; at the same time, for those generally skilled in the art, according to the idea of the present disclosure, there will be changes in the specific embodiment and the scope of application, in summary, the content of this specification should not be understood as a restriction on the present disclosure.

Those skilled in the art will easily think of other embodiments of the present disclosure after considering the description and practice of the invention disclosed herein. The present disclosure is intended to cover any variant, use, or adaptable variation of the present disclosure that follows the general principles of the present disclosure and includes common knowledge or common knowledge or customary technical means in the art not disclosed in the present disclosure. The description and embodiments are considered exemplary only, and the true scope and spirit of this disclosure are indicated by the claims below.

It should be understood that the present disclosure is not limited to the precise structure described above and shown in the accompanying drawings, and may be modified and altered without departing from its scope. The scope of this disclosure is limited only by the accompanying claims.

The term "one embodiment", "embodiment" or "one or more embodiments" herein means that the specific features, structures or characteristics described in conjunction with embodiments are included in at least one embodiment of the present disclosure. Further, it should be noted that the phrase "in one embodiment" herein does not necessarily refer to the same embodiment.

A number of specific details are explained in the instructions provided here. However, it is understood that embodiments of the present disclosure may be practiced without these specific details. In some instances, well-known methods, structures and techniques are not shown in detail so as not to obscure the understanding of this specification.

In the claims, any reference symbols located between the parentheses should not be constructed as a limitation on the claims. The word "comprise" or "comprising" does not exclude the existence of components or steps that are not listed in the claims. The word "a" or "an" before the component does not exclude the existence of more than one such component. The present disclosure may be implemented by means of hardware comprising a number of different elements and by means of a properly programmed computer. In the unit claims of the enumerated devices, several of these devices may be embodied by the same hardware. The use of the words first, second, and third does not indicate any order. These words may be interpreted as names.

Finally, it should be noted that the above embodiments are only used to illustrate the technical solution of the present disclosure, and are not limited thereto. Although the present disclosure is described in detail with reference to the foregoing embodiments, those of ordinary skill in the art should understand: they may still modify the technical solutions described in each of the foregoing embodiments, or equivalently replace some of the technical features. These modifications or replacements do not depart the essence of the corresponding technical solutions from the spirit and scope of the technical solutions of each embodiment of the present disclosure.

The invention claimed is:

1. A display panel comprising a first display area and a second display area, wherein the display panel comprises:
    a display baseplate, including a light-emitting area and a non-light-emitting area surrounding the light-emitting area; the light-emitting area including a first light-emitting area located in a first display area, and a second light-emitting area located in the second display area;
    a functional film layer disposed at a light outlet side of the display baseplate;
    a low refractive layer disposed at a side of the functional film layer away from the display baseplate, and an orthographic projection of the low refractive layer on the display baseplate is located within the scope of the non-light-emitting area;
    a first high refractive layer disposed at a side of the low refractive layer away from the display baseplate, the first high refractive layer at least covers the light-emitting area and a side of the low refractive layer facing the light-emitting area;
    wherein a refractive index of the first high refractive layer is larger than a refractive index of the low refractive layer, a side surface of the low refractive layer facing to the first light-emitting area and the first high refractive layer contact with each other to form a first total reflection interface, a side surface of the low refractive layer facing to the second light-emitting area and the first high refractive layer contact with each other to form a second total reflection interface; in a normal direction of the display baseplate, a minimum distance between the first light-emitting area and the first total reflection interface is different from a minimum distance between the second light-emitting area and the second total reflection interface.

2. The display panel according to claim 1, wherein in a plane where the display baseplate is located, the size of the first light-emitting area is smaller than the size of the second light-emitting area; in the normal direction of the display baseplate, the minimum distance between the first light-emitting area and the first total reflection interface is less than the minimum distance between the second light-emitting area and the second total reflection interface.

3. The display panel according to claim 2, wherein a thickness of the functional film layer in the first display area is less than a thickness of the functional film layer in the second display area.

4. The display panel according to claim 3, wherein the functional film layer comprises a second high refractive layer, and an orthographic projection of the second high refractive layer on the display baseplate does not overlap with the first display area.

5. The display panel according to claim 4, wherein the functional film layer further comprises: a first encapsulation layer disposed between the display baseplate and the second high refractive layer, and an orthographic projection of the first encapsulation layer on the display baseplate covers the first display area and the second display area;
    wherein a thickness of the first encapsulation layer in the first display area is less than or equal to a thickness of the first encapsulation layer in the second display area.

6. The display panel according to claim 4, wherein the second high refractive layer has the same refractive index as the first high refractive layer; or, a material of the second high refractive layer is the same as a material the first high refractive layer.

7. The display panel according to claim 3, wherein the functional film layer comprises a second encapsulation layer, an orthographic projection of the second encapsulation layer on the display baseplate covers the first display area and the second display area, a thickness of the second encapsulation layer in the first display area is less than a thickness of the second encapsulation layer in the second display area.

8. The display panel according to claim 7, wherein the second encapsulation layer comprises:
    a first inorganic film layer disposed at the light outlet side of the display baseplate;
    an organic film layer disposed at a side of the first inorganic film layer away from the display baseplate; and
    a second inorganic film layer disposed at a side of the organic film layer away from the display baseplate;
    wherein a thickness of the organic film layer in the first display area is less than a thickness of the organic film layer in the second display area.

9. The display panel according to claim 2, wherein a thickness of the functional film layer in the first display area is the same as a thickness of the functional film layer in the second display area.

10. The display panel according to claim 9, wherein the functional film layer is an encapsulation layer of the display baseplate.

11. The display panel according to claim 1, wherein the display baseplate comprises:
    a substrate;
    a pixel-defining layer disposed at one side of the substrate, wherein the pixel-defining layer is configured to define an opening area; and
    a light-emitting layer disposed at a side of the pixel-defining layer away from the substrate, wherein an orthographic projection of the light-emitting layer on the substrate covers an orthographic projection of the opening area on the substrate, the light-emitting layer is configured to form the light-emitting area;
    wherein the functional film layer is disposed at a side of the light-emitting layer and a side of the pixel-defining layer away from the substrate, and a surface of the pixel-defining layer located in the non-light-emitting area away from of the substrate is located in the same plane.

12. The display panel according to claim 1, wherein the display baseplate comprises:
    a substrate;
    a pixel-defining layer disposed at one side of the substrate, wherein the pixel-defining layer is configured to define an opening area; and
    a light-emitting layer disposed at a side of the pixel-defining layer away from the substrate, wherein an orthographic projection of the light-emitting layer on the substrate covers an orthographic projection of the opening area on the substrate, the light-emitting layer is configured to form the light-emitting area;
    wherein the functional film layer is disposed at a side of the light-emitting layer and the pixel-defining layer away from the substrate, and the side of the pixel-defining layer away from the substrate is provided with a groove, and the groove is located in the non-light-emitting area of the first display area.

13. The display panel according to claim 12, wherein in a normal direction of the display baseplate, the difference of, the minimum distance between the second light-emitting area and the second total reflection interface, and the minimum distance between the first light-emitting area and the first total reflection interface, is a first distance;
    if a thickness of the functional film layer in the first display area is the same as a thickness of the functional film layer in the second display area, then in the normal direction of the display baseplate, the depth of the groove is larger than the first distance.

14. The display panel according to claim 1, wherein a light emitting surface of the first light-emitting area and a light emitting surface of the second light-emitting area are located in the same plane.

15. The display panel according to claim 1, wherein, in a normal direction of the display baseplate, the difference of, the minimum distance between the second light-emitting area and the second total reflection interface, and the minimum distance between the first light-emitting area and the first total reflection interface, is larger than or equal to 1 micron, and less than or equal to 3 microns.

16. The display panel according to claim 1, wherein the first total reflection interface is configured for total reflection of the first display light emitted by the first light-emitting area, and the proportion of the first display light in the display light emitted by the first light-emitting area is a first proportion; the second total reflection interface is configured for total reflection of the second display light emitted by the second light-emitting area, and the proportion of the second display light in the display light emitted by the second light-emitting area is the second proportion;
    wherein the absolute value of the difference between the first proportion and the second proportion is larger than or equal to 0, and less than or equal to 0.3.

17. The display panel according to claim 1, wherein the angle between the first total reflection interface and the plane where the display baseplate is located is an acute angle of which the opening is facing away from the first light-emitting area; the angle between the second total reflection interface and the plane where the display baseplate is located is an acute angle of which the opening is facing away from the second light-emitting area.

18. The display panel according to claim 17, wherein the acute angle is larger than or equal to 20° and less than or equal to 80°.

19. The display panel according to claim 1, wherein the difference between a refractive index of the first high refractive layer and a refractive index of the low refractive layer is larger than 0 and less than or equal to 0.3.

20. A display device, comprising a display panel according to claim 1.

\* \* \* \* \*